US007787258B2

(12) United States Patent
Cheney et al.

(10) Patent No.: US 7,787,258 B2
(45) Date of Patent: Aug. 31, 2010

(54) TRACK-BASED SUPPORT SYSTEM FOR ELECTRONIC CARDS

(75) Inventors: Lorin David Cheney, Wake Forest, NC (US); Walter Adrian Goodman, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 532 days.

(21) Appl. No.: 11/850,943

(22) Filed: Sep. 6, 2007

(65) Prior Publication Data

US 2009/0067136 A1 Mar. 12, 2009

(51) Int. Cl.
*H05K 7/12* (2006.01)

(52) U.S. Cl. .................. 361/801; 361/759; 361/747; 312/223.2

(58) Field of Classification Search ............... 361/726, 361/732, 759, 740, 747, 801; 312/223.2, 312/223.3
See application file for complete search history.

(56) References Cited

U.S. PATENT DOCUMENTS

| | | | |
|---|---|---|---|
| 5,383,793 A | 1/1995 | Hsu et al. | |
| 5,623,396 A | 4/1997 | Blackwell | |
| 5,822,193 A | 10/1998 | Summers et al. | |
| 5,996,962 A | 12/1999 | Chang et al. | |
| 6,220,887 B1 * | 4/2001 | Downs | 439/377 |
| 6,229,709 B1 | 5/2001 | Hardt et al. | |
| 6,299,468 B1 | 10/2001 | Lin | |
| 6,409,518 B1 * | 6/2002 | Hung | 439/61 |
| 6,885,565 B2 | 4/2005 | Shi | |
| 7,140,900 B1 | 11/2006 | Villanueva | |
| 7,278,872 B2 * | 10/2007 | Brown et al. | 439/351 |
| 7,564,697 B2 * | 7/2009 | Chen | 361/801 |
| 2006/0128200 A1 | 6/2006 | McEwan et al. | |

* cited by examiner

*Primary Examiner*—Dameon E Levi
(74) *Attorney, Agent, or Firm*—Cynthia G. Seal; Jeffrey L. Streets

(57) ABSTRACT

An apparatus and method provide supplemental support to an electronic card from above, such as along a longitudinal edge of a PCI card opposite an edge connector on the motherboard. The supplemental support may be provided at any of a plurality of locations along the edge of the card, to avoid interference with certain features on the card and to accommodate cards of a variety of shapes and sizes. One embodiment provides a support apparatus that includes a track secured to the computer chassis over the card, and is generally aligned with a longitudinal edge of the electronic card. A collar is disposed on the track and is moveable to any of a plurality of positions along the track. A plunger is inserted through the collar and is movable with respect to the collar into engagement with the longitudinal edge of the electronic card. A first locking member is activated in response to inserting the plunger into the collar to prevent relative movement of the collar and the plunger with respect to the track. A second locking member locks the plunger with respect to the collar when the plunger engages the card.

20 Claims, 4 Drawing Sheets

TRACK-BASED SUPPORT SYSTEM FOR ELECTRONIC CARDS

BACKGROUND OF THE INVENTION

1. Field of the Invention

The invention relates to computer system chassis design. More particularly, the invention relates to supporting electronic expansion cards mounted to a motherboard.

2. Description of the Related Art

Computer system such as PCs and servers typically include a central or primary circuit board, commonly referred to as a "motherboard," "baseboard," or "system board," providing electrical and logical connections by which components communicate. A motherboard typically includes integrated components, such as processors, drive controllers, video controllers, primary memory, interrupt controllers, and BIOS, as well as electronic connectors for connecting additional components. A component that interfaces with a motherboard connector may take the form of a separate circuit board generally referred to herein as an "electronic card." An expansion card is an electronic card that removably interfaces with a motherboard to provide additional functionality. Common examples of expansion cards include peripheral component interconnect (PCI) and industry standard architecture (ISA) expansion cards known in the art. An expansion card includes electrical contacts on one edge that fit into the slot of a corresponding "edge connector" on the motherboard, to provide electronic communication between the expansion card and the motherboard. The use of expansion cards and other electronic cards is not limited to PCs and servers, however. Expansion cards may also be found in other types of electronic applications having a primary circuit board, such as in gaming consoles.

Most edge connectors provide some structural and mechanical support to the expansion card along an edge of the expansion card. The edge connector typically provides a friction fit with the expansion card, which helps retain the card on the connector and holds the card in a desired orientation (such as 90 degrees) with respect to the motherboard. An adjacent edge of the expansion card may also be supported by a back wall of the computer chassis. Though the support provided at the edge connector and back wall of the chassis may be sufficient to hold the expansion card in the desired orientation when the chassis is stationary, the unsupported edges can be a source of structural vulnerability. For example, when the chassis is open, the card may be inadvertently bumped at the unsupported edge. Also, movement of the chassis when transporting or installing the chassis can cause undesirable movement of the card under its own inertia. Such impacts or movement can partially unseat the card from its edge connector, causing a loss of electronic communication between the card and connector. If the card is directly impacted, the card or connector may even be damaged. Additional support is, therefore, desired. In particular, heavier PCI cards, and especially video cards and cards with top cabling, need additional support to ensure they remain seated on the motherboard during transportation.

A number of card retention devices are available in the industry for providing supplemental support to expansion cards while connected to a motherboard. However, these devices typically provide such support at a fixed, pre-selected support location along the expansion card. This is a problem because of the multitude of different sizes, designs, and features of cards available. Thus, a number of electronic cards will inevitably be structurally incompatible with currently available card retention devices, such as due to the shape of the card or due to particular features on the card that interfere with a card retention device at the intended support locations. Therefore, there is a need for improved systems to support electronic cards secured to a circuit board. In particular, it would be desirable to have a card retention device that is capable of supporting an electronic card regardless of the variances in shape, size and features among compatible cards.

SUMMARY OF THE INVENTION

The invention provides apparatuses and methods for supporting electronic cards in a computer chassis. In a first embodiment, a track is secured to the computer chassis over the electronic card and generally parallel with a longitudinal edge of the electronic card. A plunger support member is secured to the track and is moveable to any of a plurality of positions along the track. A plunger is movably secured to the plunger support member and movable with respect to the plunger support member into engagement with the longitudinal edge of the electronic card for structurally supporting the electronic card. A first locking member is activated in response to positioning the plunger on the plunger support member for preventing relative movement between the plunger support member and the track.

A second embodiment provides an apparatus for supporting a plurality of electronic cards in a computer chassis. A plurality of tracks are secured to the computer chassis over a plurality of electronic cards, wherein each track is generally aligned over a longitudinal edge of a associated one of the electronic cards. A plurality of independently moveable plunger support members are each movably secured to an associated one of the tracks. Each plunger support member is moveable to any of a plurality of positions along the associated track. Each of a plurality of plungers is supported on an associated one of the plunger support members. Each plunger is movable with respect to the associated plunger support member into engagement with the longitudinal edge of the associated electronic card for supporting the associated electronic card. A first locking member is associated with each track. Each first locking member is activated in response to positioning the plunger on the associated plunger support member for preventing relative movement between the plunger support member and the track.

A third embodiment provides a method for supporting an electronic card in a computer chassis. A track is provided on the computer chassis over the electronic card in general alignment with a longitudinal edge of the electronic card. A plunger support member is positioned on the track at a selected one of a plurality of positions along the track. A plunger is movably secured to the plunger support member. The plunger is moved with respect to the plunger support member into engagement with the longitudinal edge of the electronic card to support the electronic card. The plunger support member is locked to the track in response to supporting the plunger on the plunger support member for preventing relative movement between the plunger support member and the track.

Other embodiments, aspects, and advantages of the invention will be apparent from the following description and the appended claims.

DETAILED DESCRIPTION OF PREFERRED EMBODIMENTS

Figure 1:
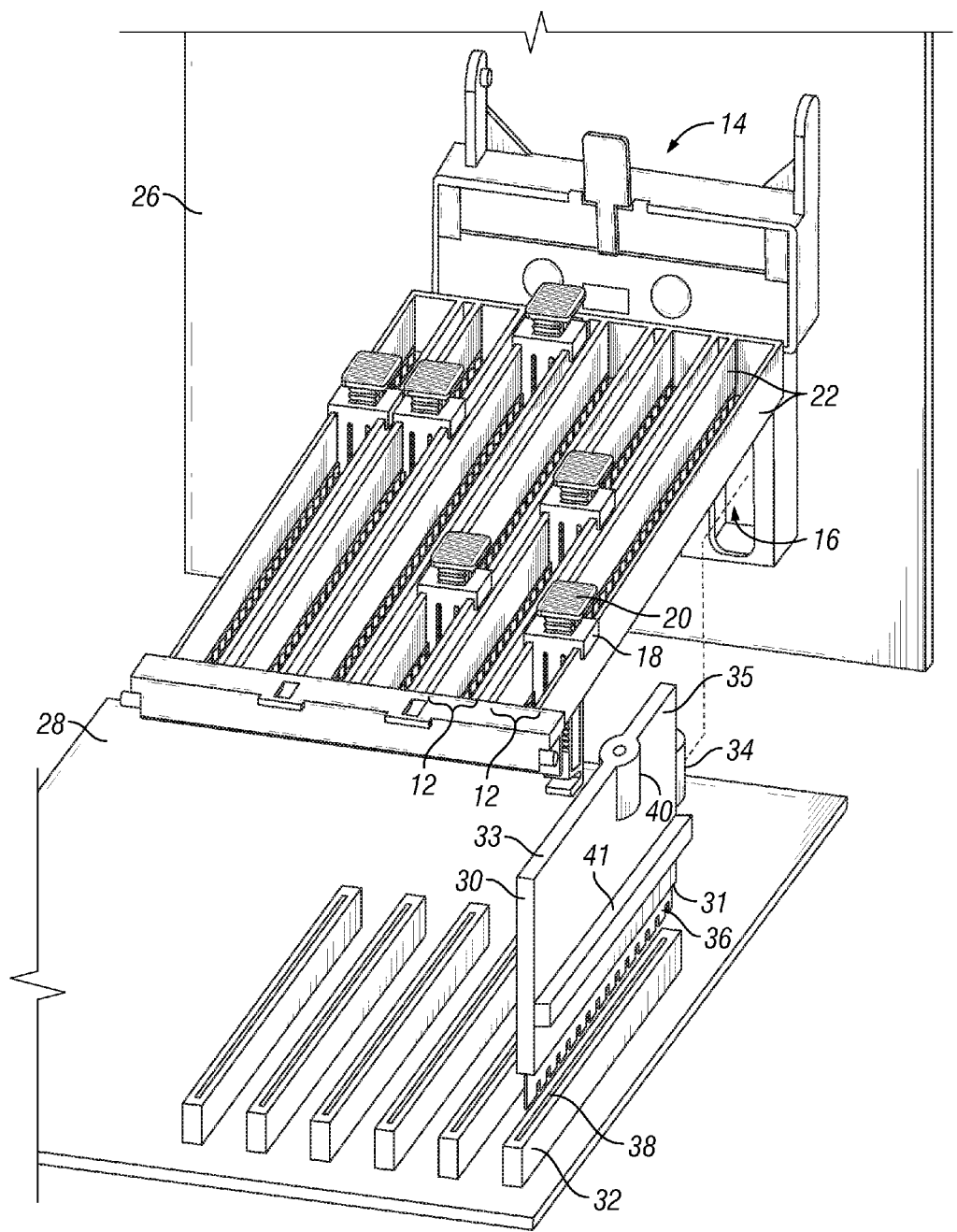
FIG. 1 is an exploded perspective view of a track-based support apparatus in a computer chassis for supporting expansion cards installed on a motherboard.

The present invention provides an apparatus and method for supporting one or more electronic cards such as PCI expansion cards on a motherboard. Each card may be partially conventionally supported along one edge by an edge connector and along an adjacent edge by the chassis. According to one aspect of the invention, further structural support is provided to each card, such as along a longitudinal edge of the card opposite the edge connector on the motherboard. Each card may be biased into engagement with its associated edge connector to maintain electronic communication between the card and connector, and to reinforce the lateral support provided to each card by the edge connector. The additional support thereby secures each card in place, to protect the card from direct impingement, shock, or vibration, such as may be caused by working inside an exposed chassis or when moving the computer chassis during shipping and installation. The invention allows the card, in most cases, to be supported without regard to the shape and size of the card. In particular, the location of the support is user-selectable, to avoid interference with any structural features along the longitudinal edge of the card. Also, supporting the card from above, along the longitudinal edge of the card opposite the edge connector, avoids interference with any structural features on the side of the card.

One embodiment of the invention provides a track-based support apparatus for supporting an electronic card at a user-selectable position along a longitudinal edge of the card. The apparatus includes a track secured to the chassis over the card and oriented parallel with the longitudinal edge of the card opposite the edge connector. A plunger support member is movably secured to the track over the card. The plunger support member may be positioned along the track at a selected position with respect to the card. After the plunger support member is positioned, a plunger may then be secured to the plunger support member and moved into engagement with the longitudinal edge of the card to provide additional structural support to the card. The support apparatus includes a "first" locking member that locks the plunger support member at the selected track position upon positioning the plunger on the plunger support member. A "second" locking member may be included for locking the plunger with respect to the collar once the plunger has engaged the card. The user-selectable positioning of the plunger support member allows the plunger support member to be positioned at a track position that will avoid interference between the plunger and any features along the longitudinal edge of the card.

In one variation of this embodiment, the track includes a pair of rails oriented parallel to the longitudinal edge of the card. The plunger support member is a collar, and the plunger is inserted through the collar to engage the longitudinal edge of the card. One variation of the first locking member includes a plurality of teeth on the track and one or more teeth on the collar. When the plunger is inserted, the collar teeth are moved into engagement with the track teeth, to lock the collar at the selected position. The second locking member includes a plurality of teeth on the plunger and one or more other teeth on the collar. The plunger teeth engage the other collar teeth to lock the plunger in a desired position within the collar. The plunger may include a sloping card engagement portion at the end of the plunger. The angle of the sloping card engagement portion urges the plunger in a direction that engages the plunger teeth and the other collar teeth to lock the plunger with respect to the plunger support member in response to the plunger engaging the card. A relief portion may be provided behind the sloping plunger support member to allow flexure of the engagement portion, which provides some amount of plunger movement upon engagement of the card to soften the engagement of the plunger with the card.

The adjustability and versatility of the support apparatus according to the invention has numerous advantages. The ability to select the position of the collar and plunger allows the user to support the card at any location along the edge of the card while avoiding any feature at another location along the edge of the card that would otherwise interfere with engaging the card at that location. The orientation of the plunger further helps avoid other features that may occur along the side of the card. The length of the plunger even adjusts to support cards of different heights. The track is positioned over the longitudinal edge of the card and the plunger is moved into engagement with the longitudinal edge of the card without requiring the plunger to extend along the side of the card. Thus, any card features that may project from the side of the card also do not interfere with the positioning of the plunger. The support apparatus may be adapted for use with existing computer systems, so that it is not necessary to redesign the motherboard or the arrangement of the electronic cards supported thereon. The support apparatus may also be adapted to work with existing chassis designs, to avoid substantial redesign of existing computer chassis.

FIG. 1 is an exploded perspective view of a track-based support apparatus 10 in a computer chassis 26 for supporting expansion cards 30 installed on a motherboard 28. Each edge connector 32 may receive an associated expansion card 30. The expansion card 30 includes a series of electrical contacts or "pins" 36, which interface with mating pins in a slot 38 of the edge connector 32, to enable electronic communication between the expansion card 30 and other components connected to the motherboard 28. The edge connector 32 provides at least some mechanical support to the expansion card 30 by removably securing the card 30 at an edge 31 of the expansion card 30. A friction fit between the card 30 and the slot 38 helps retain the card 30 in the slot 38, and a conventional latch (not shown) included with the edge connector 32 may help lock the card 30 to the edge connector 32 when the card 30 is fully seated in the slot 38. If solely supported by the edge connector 32, the card 30 would be supported as a cantilever beam at the edge connector 32. However, the chassis 26 may provide additional card support on an adjacent edge 35 using screws or other fastening members known in the art that secure the adjacent edge 35 to the chassis 26. Even if supported by the edge connector 32 at the edge 31 and by the chassis 26 at the adjacent edge 35, as in the prior art, the longitudinal edge 33 would still remain unsupported and would be a source of vulnerability to the card 30. Therefore, the support apparatus 10 according to the invention engages the longitudinal edge 33 of each card 30 with a plunger 20 supported on a track 12 above the card 30, to provide additional support to the expansion card 30 along the longitudinal edge 33. This support is provided at a user-selectable position along a longitudinal edge 33 of the card 30 opposite the edge connector 32. The support provided by the support apparatus 10 may include both lateral support at the longitudinal edge 33, as well as a force directed against the longitudinal edge 33 in the plane of the card 30, toward the edge connector 32, to urge or retain the card 30 in engagement with the edge connector 32.

The support apparatus 10 includes a card guide 14 and a plurality of the tracks 12 extending from the card guide 14 above the expansion cards 30. Each track 12 is associated with a particular edge connector 32 and the card 30 connected to the edge connector 32. The card guide 14 may be attached to or integrally formed with a wall of the computer chassis 26. An aperture 16 in the card guide 14 receives an external connectivity port 34 on the expansion card 30 used for making external connections, such as to attach peripherals, a modem line, or an Ethernet cable. Each track 12 is generally aligned with an edge connector 32 and is parallel with the longitudinal edge 33 of the expansion card 30. The track 12 preferably extends over the entire length of the respective expansion card 30 in order to provide for support at any selected point along the longitudinal edge 33 of the card 30. Each track 12 is capable of supporting at least one plunger 20 for engagement of the plunger 20 with the card 30. In this embodiment, an intermediary collar 18 is secured to the track 12 and the plunger 20 is movably secured on the collar 18 by inserting the plunger 20 through the collar 18.

The collar 18 is one variation of a "plunger support member," though a plunger support member need not be collar shaped in every embodiment of the invention, and the plunger 20 in such other embodiments may be supported on the plunger support member other than by insertion of the plunger into the plunger support member. For example, another variation of a plunger may slip over the plunger support member rather than being inserted through the plunger support member. In another embodiment, a plunger may be supported directly on a track, without an intermediary plunger support member. In each of these embodiments, the plunger is moveable into engagement with the longitudinal edge 33 of the card 30 to support the card along this edge 33.

In the orientation shown, the chassis 26 is "right side up," and the tracks 12 are at a higher elevation than the card 30. However, the support apparatus 10 would work in any orientation of the chassis 26 wherein the motherboard 28 and support apparatus 10 have the same relative position with respect to the card 30. Thus, regardless of the orientation of the chassis 26, the relative position of the tracks 12 may be described as being positioned "above" or "over" the card 30. Alternatively, the tracks 12 may be described as being opposite the motherboard 28 with respect to the card 30, wherein the card 30 is positioned between the motherboard 28 and the tracks 12.

Complicating the challenge of supporting the expansion card 30, the expansion card 30 includes a "feature" 40 along the longitudinal edge 33 and another feature 41 on the side of the card 30. The presence of the feature 40 may make it undesirable or impossible to support the expansion card 30 at that location along the edge 33 of the card 30. For example, the feature 40 may be a port or jack 40 that should remain unobstructed, or the feature 40 may simply interfere physically with supporting the card at that location. Therefore, the selectively positionable collar 18 and plunger 20 provides independently adjustable support to each card 30 at a selected location along the longitudinal edge 33 to avoid the feature 40. The track may extend over the entire length of the card 30, to provide support at any location along the edge 33. More than one collar 18 and plunger 20 may be installed on each track 12 to support each card 30 at more than one location along the track 12. Likewise, the feature 41 may make it undesirable or impossible for any feature of the support apparatus 10 to be positioned closely to the side of the card 30. The example of the feature 41 shown is a ridge projecting significantly from the side of the card 30, which would interfere with some prior art support card support systems. Thus, the support apparatus 10 provides support from above the card 30 rather than along the side of the card 30. The adjustability of the height of the plunger 20 also allows the apparatus 10 to accommodate different card heights.

Figure 2:
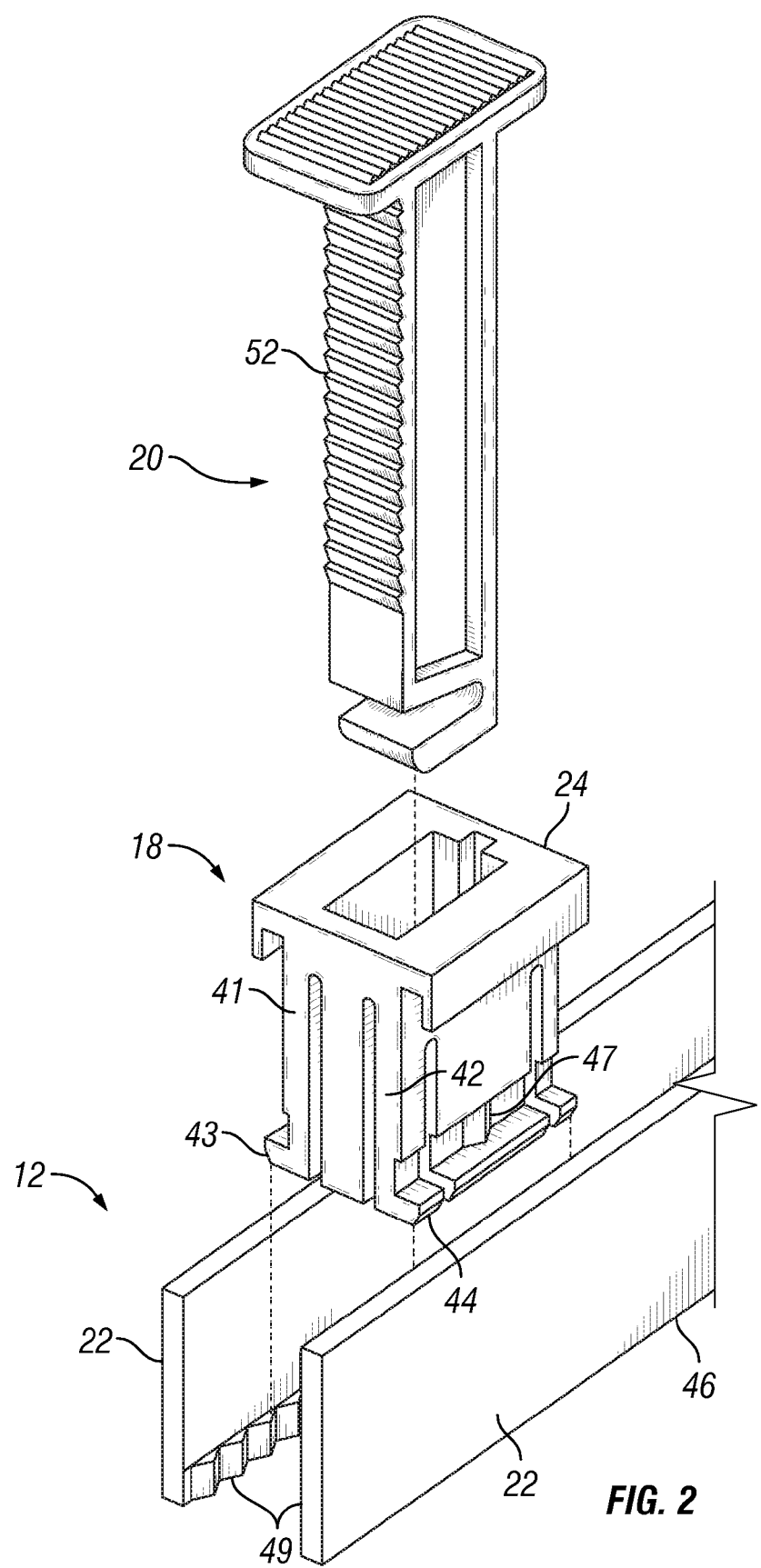
FIG. 2 is an exploded, perspective view of a corresponding track, collar, and plunger.

FIG. 2 is an exploded, perspective view of a corresponding track 12, collar 18, and plunger 20. The track 12 includes a pair of parallel rails 22. The collar 18 includes two flexible legs 41, 42 having retaining hooks 43, 44 on the end. An outwardly projecting tooth 47 is disposed on the legs 41, 42, and the rails 22 include inwardly projecting teeth 49. The legs 41, 42 may be inwardly-directed (toward one another) sufficiently to allow the hooks 43, 44 to clear the rails 22 as the collar 18 is inserted between the rails 22. If the plunger 20 is subsequently removed from the collar 18, the legs 41, 42 will return to their inwardly-directed position to allow easy removal of the collar 18. In another embodiment, the legs 41, 42 might not be inwardly directed, but instead have an interference fit with the track 12 that would require forcible insertion of the collar 18 onto the track 12, so the collar 18 "snaps" into place on the track 12. The retaining hooks 43, 44 may include a sloped leading edge that urges the legs 41, 42 inwardly when the collar 18 is inserted between the rails 22. A flange 24 on the collar 18 retains the collar 18 on the track 12. The collar 18 may be inserted anywhere between the rails 22 and moved to any selected location by sliding the collar 18 along the track 12.

Figure 3:
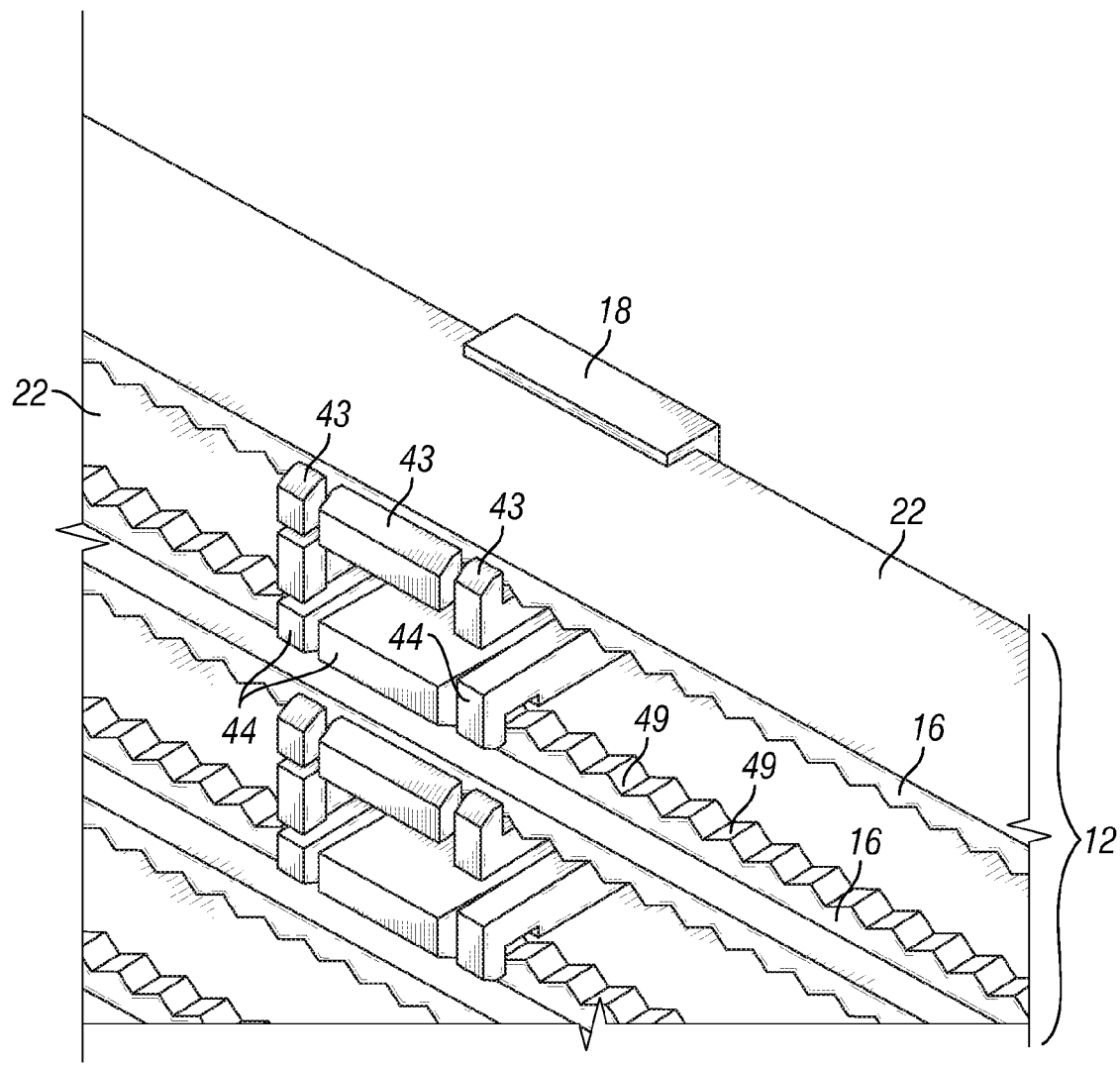
FIG. 3 is a perspective view of the collar from below, as positioned on the track.

With the collar 18 positioned at the selected location, the plunger 20 may then be inserted and moved in a direction perpendicular to the rails 22 into engagement with the card 30 of FIG. 1. The plunger 20 includes a shallow recess 21 for receiving the longitudinal edge 33 of the card 30 of FIG. 1. Though shallow, the recess 21 is sufficiently deep to retain the longitudinal edge 33 within the recess 21 and to provide lateral support to the card 30 along the longitudinal edge 33. Insertion of the plunger 20 also locks the collar 18 in its selected position along the length of the track 12. The breadth of the plunger 20 urges the legs 41, 42 outwardly when inserted into the collar 18. This outward movement of the legs 41, 42 causes the retaining hooks 43, 44 to catch on an edge 46 of the rails 22, thereby retaining the collar on the track 12 to prevent inadvertent removal of the collar 18 while the plunger 20 remains inserted. This outward movement of the legs 41, 42 simultaneously engages the tooth 47 on the collar 18 with the teeth 49 on the track 12, to lock the collar at the selected location along the track 12. Thus, with the plunger 20 inserted, the collar 18 cannot be moved from its selected position on the track 12. FIG. 3 is a perspective view of the collar 18 from below when positioned on the track 12, further illustrating the retaining hooks 43, 44 retaining the collar 18 on the track 12.

Figure 4:
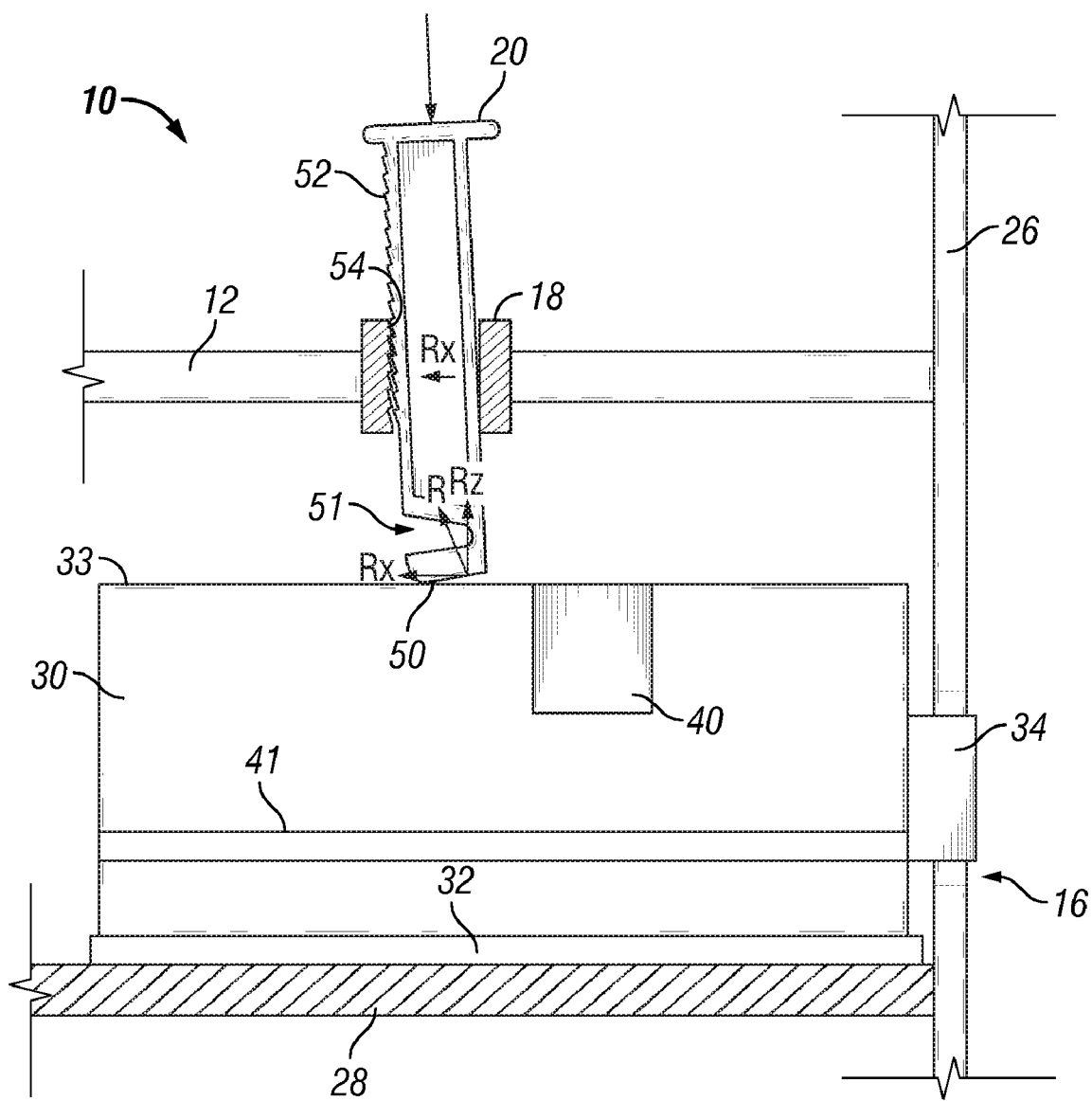
FIG. 4 is a side view of the support apparatus supporting the expansion card at a selected location along the longitudinal edge.

FIG. 4 is a side view of the support apparatus 10 supporting the expansion card 30 at a selected location along the longitudinal edge 33. The expansion card 30 is inserted in the edge connector 32 provided on the motherboard 28. The track 12 is generally aligned with the longitudinal edge 33 of the expansion card 30 along the full length of the expansion card 30, so that the collar 18 and plunger 20 may be positioned to support the card 30 at any selected location along the longitudinal edge 33. With the collar 18 seated on the track 12, the plunger 20 is inserted into the collar 18 until an end 50 of the plunger 20 contacts the edge 33 of the card 30. The plunger 20 includes a plurality of teeth 52 configured to mate with teeth 54 on the collar 18. As shown, the collar 18 and plunger 20 may be provided with a small amount of lateral "play" so that the teeth 52 on the plunger 20 may clear the teeth 54 on the collar 18 as the plunger 20 is inserted. A relief groove 51 is provided above the end 50, which allows the end 50 to flex as it engages the card 30. This flex helps cushion the engagement of the plunger 20 with the card 30, to protect the card 30. This flex also allows for additional downward movement of the plunger 20 after making initial contact with the card 30, to achieve the desired relative position between the plunger teeth 52 and the collar teeth 54. The end 50 of the plunger that engages the card 30 is sloping so that the reaction force against the end 50 of the plunger 50 includes a lateral component "Rx" to engage the plunger teeth 52 with the collar teeth 54 in response to engagement of the plunger 20 with the card 30. Thus, upon engagement of the plunger 20 with the card 30, the user may perceive a "ratcheting" action of the plunger 20. The reaction force R is sufficient to "lock" the plunger 20 in place. The plunger 20 may be subsequently released if desired by moving the plunger 20 by hand to the right to overcome the reaction force component Rx. This movement by hand may be perceived by the user as "releasing" the perceived ratcheting mechanism.

The embodiments shown and described are exemplary. Some variations of the support apparatus and method according to the invention have been suggested above, and additional variations may be apparent to one skilled in the art having possession of this disclosure, without departing from the scope of the invention. In any of its many potential embodiments, the invention provides an improved way to support electronic cards. The invention may be used to accommodate cards having a variety of shapes, sizes, and structural features. The expansion card or other electronic card is supported from above to minimize interference with any features on the side of the expansion card. The adjustability of the plunger support members and their respective plungers accommodates a variety of card shapes and designs. The ratcheting action and adjustable depth of the plunger also helps to accommodate cards of different card heights. The invention both supports and helps retain the electronic cards in electronic communication with their associated edge connectors. The support provided is particularly useful when shipping and transporting computer equipment housing electronic cards, and while working inside the chassis, to prevent the electronic cards from becoming unseated from their edge connectors.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for supporting an electronic card in a computer chassis, comprising:
    a track secured to the computer chassis over the electronic card and generally parallel with a longitudinal edge of the electronic card;
    a plunger support member secured to the track and moveable to any of a plurality of positions along the track;
    a plunger movably secured to the plunger support member and movable with respect to the plunger support member into engagement with the longitudinal edge of the electronic card for structurally supporting the electronic card; and
    a first locking member activated in response to positioning the plunger on the plunger support member for preventing relative movement between the plunger support member and the track.

2. The apparatus of claim 1, wherein the first locking member comprises a plurality of teeth on one of the plunger support member and the track and at least one opposing tooth on the other of the plunger support member and the track, wherein the plurality of teeth interfere with the at least one tooth to prevent movement of the plunger support member along the track.

3. The apparatus of claim 2, wherein the at least one tooth is disposed on a leg of the plunger support member, wherein the leg is urged outwardly in response to supporting the plunger on the plunger support member to move the at least one tooth into engagement with the plurality of teeth.

4. The apparatus of claim 1, further comprising a second locking member for preventing relative movement between the plunger and the plunger support member.

5. The apparatus of claim 4, wherein the engagement of the plunger with the electronic card activates the second locking member.

6. The apparatus of claim 4, wherein the second locking member comprises a plurality of teeth on one of the plunger support member and the plunger and at least one opposing tooth on the other of the plunger support member and the plunger.

7. The apparatus of claim 6, wherein the plunger comprises a sloping electronic card engagement portion that urges the plunger against the plunger support member in response to engagement of the plunger with the electronic card to engage the plurality of teeth and the at least one opposing tooth of the second locking member.

8. The apparatus of claim 6, further comprising a relief groove behind a electronic card engagement portion of the plunger for allowing the electronic card engagement portion to flex in response to engagement of the plunger with the electronic card.

9. The apparatus of claim 1, wherein the track comprises a pair of parallel, spaced rails, and wherein the plunger support member is slidably supported between the parallel rails.

10. The apparatus of claim 1, wherein the electronic card comprises a PCI electronic card.

11. An apparatus for supporting a plurality of electronic cards in a computer chassis, comprising:
    a plurality of tracks secured to the computer chassis over a plurality of electronic cards, wherein each track is generally aligned over a longitudinal edge of a associated one of the electronic cards;
    a plurality of independently moveable plunger support members, each movably secured to an associated one of the tracks and moveable to any of a plurality of positions along the associated track;

a plurality of plungers, each movably secured to an associated one of the plunger support members and movable with respect to the associated plunger support member into engagement with the longitudinal edge of the associated electronic card for supporting the associated electronic card; and a first locking member associated with each track and activated in response to positioning the plunger on the associated plunger support member for preventing relative movement between the plunger support member and the track.

12. The apparatus of claim 11, wherein the plurality of electronic cards are generally parallel with each other electronic card and the plurality of tracks are substantially parallel with respect to each other electronic card.

13. The apparatus of claim 11, wherein the plunger support member comprises a collar for receiving the plunger.

14. A method for supporting an electronic card in a computer chassis, comprising:

providing a track on the computer chassis over the electronic card in general alignment with a longitudinal edge of the electronic card;

positioning a plunger support member on the track at a selected one of a plurality of positions along the track;

movably securing a plunger on the plunger support member and moving the plunger with respect to the plunger support member into engagement with the longitudinal edge of the electronic card to support the electronic card; and locking the plunger support member to the track in response to supporting the plunger on the plunger support member for preventing relative movement between the plunger support member and the track.

15. The method of claim 14, further comprising:
identifying a feature to avoid on the electronic card; and
positioning the plunger support member on the track at a position such that the plunger avoids the feature to avoid when moved into engagement with the electronic card.

16. The method of claim 14, wherein the step of locking the plunger support member to the track comprises urging a plurality of teeth on one of the plunger support member and the track into engagement with at least one opposing tooth on the other of the plunger support member and the track.

17. The method of claim 16, wherein the step of urging the plurality of teeth into engagement with the at least one opposing tooth further comprising urging a leg of the plunger support member outwardly in response to supporting the plunger on the plunger support member to move the at least one tooth into engagement with the plurality of teeth.

18. The method of claim 14, further comprising locking the plunger with respect to the plunger support member after moving the plunger into engagement with the longitudinal edge of the electronic card.

19. The method of claim 14, wherein the step of locking the plunger with respect to the plunger support member comprises urging a plurality of teeth on one of the plunger support member and the plunger into engagement with at least one opposing tooth on the other of the plunger support member and the plunger.

20. The method of claim 14, further comprising packaging and shipping the computer chassis after moving the plunger into engagement with the longitudinal edge of the electronic card.

* * * * *